(12) United States Patent
Kraft et al.

(10) Patent No.: US 7,629,628 B2
(45) Date of Patent: Dec. 8, 2009

(54) BIPOLAR TRANSISTOR INCLUDING A BASE LAYER CONTAINING CARBON ATOMS AND HAVING THREE DISTINCT LAYERS BEING DOPED WITH A TRIVALENT SUBSTANCE

(75) Inventors: Jochen Kraft, Bruck/Mur (AT); Bernhard Loeffler, Gleisdorf (AT); Georg Roehrer, Graz (AT)

(73) Assignee: Austriamicrosystems AG, Unterpremstätten (AT)

( * ) Notice: Subject to any disclaimer, the term of this patent is extended or adjusted under 35 U.S.C. 154(b) by 289 days.

(21) Appl. No.: 10/500,079

(22) PCT Filed: Dec. 20, 2002

(86) PCT No.: PCT/EP02/14679

§ 371 (c)(1),
(2), (4) Date: Mar. 1, 2005

(87) PCT Pub. No.: WO03/056630

PCT Pub. Date: Jul. 10, 2003

(65) Prior Publication Data

US 2005/0127476 A1 Jun. 16, 2005

(30) Foreign Application Priority Data

Dec. 27, 2001 (DE) ............... 101 64 176

(51) Int. Cl.
*H01L 29/737* (2006.01)

(52) U.S. Cl. ............. 257/197; 257/592; 257/E27.053; 257/E27.074

(58) Field of Classification Search ................. 257/197, 257/200, 565, 592, E27.053, E27.072, E27.074
See application file for complete search history.

(56) References Cited

U.S. PATENT DOCUMENTS

| | | | |
|---|---|---|---|
| 5,140,400 A * | 8/1992 | Morishita | .............. 257/197 |
| 5,589,409 A | 12/1996 | Bulucea et al. | |
| 5,693,979 A | 12/1997 | Sato | |
| 5,962,880 A | 10/1999 | Oda et al. | |
| 6,563,147 B1 | 5/2003 | Ikeda | |

FOREIGN PATENT DOCUMENTS

| | | |
|---|---|---|
| DE | 100 60 584 | 7/2001 |
| EP | 0 701 287 | 3/1996 |

(Continued)

OTHER PUBLICATIONS

Böck, J. et al. "SiGe Bipolar Technology for Mixed Digital and Analogue RF Applications" Infineon Technologies, 2000 IEEE; 0-7803-6441-4.

(Continued)

*Primary Examiner*—Anh D Mai
(74) *Attorney, Agent, or Firm*—Fish & Richardson P.C.

(57) ABSTRACT

A transistor includes an emitter, a collector, and a base layer having a base contact. The base layer includes an intrinsic region between the emitter and the collector, an extrinsic region between the intrinsic region and the base contact, and a first doping layer that is doped with a trivalent substance, that extends into the extrinsic region, and that is counter-doped with a pentavalent substance in a region adjacent to the emitter.

13 Claims, 2 Drawing Sheets

FOREIGN PATENT DOCUMENTS

| EP | 1 263 052 | 12/2002 |
|---|---|---|
| JP | 04099328 | 3/1992 |
| WO | WO01/91162 | 11/2001 |

OTHER PUBLICATIONS

Gruhle, A. et al. "The Reduction of Base Dopant Outdiffusion in SiGe Heterojunction Bipolar Transistors by Carbon Doping" Applied Physics Letter 1999, vol. 75, No. 9 pp. 1311-1313 XP000868226.

Ryum, B.R. et al "MBE-grown SiGe base HBT with Polysilicon-emitter and TiSi2 Base Ohmic Layer" Solid-State Electronics 1996, vol. 39, No. 11, pp. 1643-1648, XP000635613.

Osten, H.L. et al "The Effect of Carbon Incorporation on SiGe Heterobipolar Transistor Performance and Process Margin" Electron Devices Meeting 1997, pp. 803-806 XP10265625.

Liu J.P. et al "Substitutional Carbon Incorporation During Si1-x-yGexCy Growth on Si(100) by Molecular-beam Epitaxy:Dependence on Germanium and Carbon" Applied Physics Letters; 2000,vol. 76, No. 24 pp. 3546-3548.

Translation of International Preliminary Examination Report for Application No. PCT/EP2002/014679.

Greve, D., "Growth of Epitaxial Germanium- Silicon Heterostructures by Chemical Vapour Deposition", Material Science and Engineering, B18, pp. 22-51 (1993).

Lanzerotti, L. D. et al.: "Suppression of Boron Outdiffusion in SiGe HBTs by Carbon Incorporation", IEEE 1996, 0-7803-3393-4.

Osten, H. J. et al.: "Substitutional Versus Interstitial Carbon Incorporation During Pseudomorphic Growth of Si1-yCy on Si(OO1)", Journal of Applied Physics, vol. 80(12), pp. 6711-6715 (1996).

Zerlauth, S. et al.: "Growth Conditions for Complete Substitutional Carbon Incorporation into Si1-yCy Layers Grown by Molecular Beam Epitaxy", Applied Physics Letters, vol. 71(26), pp. 3826-3828 (1997).

* cited by examiner

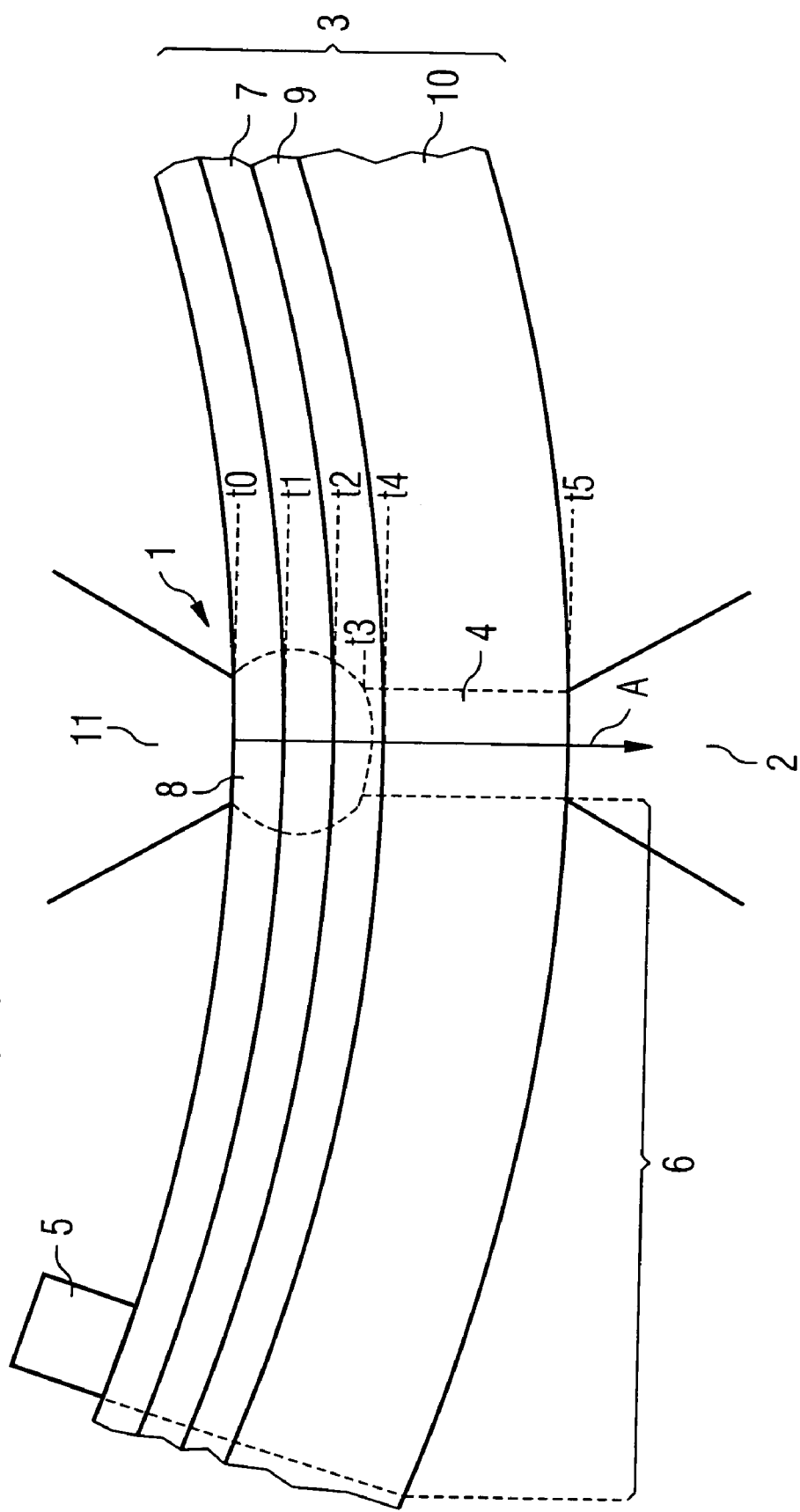

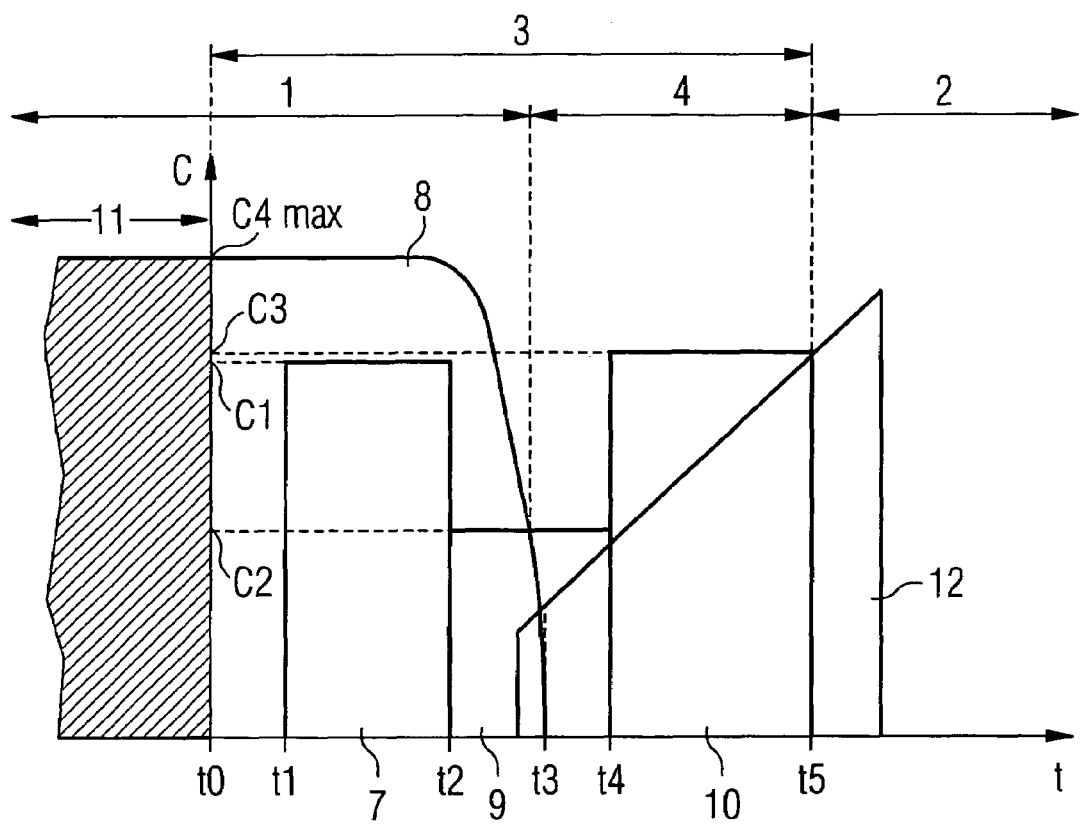

BIPOLAR TRANSISTOR INCLUDING A BASE LAYER CONTAINING CARBON ATOMS AND HAVING THREE DISTINCT LAYERS BEING DOPED WITH A TRIVALENT SUBSTANCE

TECHNICAL FIELD

This patent application relates to a transistor with an emitter, a collector, and a base layer.

BACKGROUND

Transistors are known from the publication "SiGe Bipolar Technology for Mixed Digital and Analog RF Applications," J. Böck et al., *IEEE* 2000, in which the base layer has an intrinsic segment and an extrinsic segment, where the extrinsic segment connects a base contact with the intrinsic segment. The extrinsic segment has a relatively low boron doping, so that the known transistor has the disadvantage of a high resistance in the base layer. This leads to a drop in power amplification already at low frequencies, and thereby to an effective slow-down of the transistor. In addition, the higher base feed resistance causes greater noise.

SUMMARY

A transistor is disclosed that has an emitter, a collector, and a base layer. The emitter extends into the base layer. The base layer has an intrinsic region arranged between the emitter and the collector. Furthermore, the emitter has an extrinsic region that runs between a base contact and the intrinsic region of the base layer. The base layer contains a first doping layer that runs within the base layer, which is doped with a trivalent doping substance. The first doping layer extends into the extrinsic region and also runs in the region of the emitter, where it is counter-doped with a pentavalent doping substance.

The transistor has the advantage that doping of the base layer can be undertaken via the first doping layer, which extends into the extrinsic region and also runs into the emitter, thereby advantageously reducing the resistance of the base layer. In this way, electrical losses of the transistor can be reduced.

Because the first doped layer runs both in the extrinsic region of the base layer and in the region of the emitter, it can be produced via usual methods for doping base layers, without any additional structuring step. Usual methods are: doping via implantation, as well as epitactic depositing.

Through doping, additional charge carriers in the form of holes in the base layer are made available, thereby increasing the conductivity of the base layer. In this way, the resistance between the base contact, where the base layer is contacted from the outside, and the intrinsic base is reduced.

Advantageously, boron can be used as a trivalent doping substance for the first doping layer. Boron has the advantage that its activation energy of the holes is the lowest of all trivalent doping substances. As a result, doping with boron already works at room temperature.

Additional doping layers can be arranged between the first doping layer and the collector. A second doping layer and a third doping layer are envisioned, for example. The second doping layer is arranged between the first doping layer and the third doping layer. The second and third doping layers are each doped with a trivalent doping substance, such as boron. The doping-substance concentration of the second doping layer is less than the doping-substance concentration of the first and third doping layers.

The low doping-substance concentration of the second doping layer has the advantage that in this way, the PN transition on the base side settles in a region with a low doping-substance concentration. In this way, the emitter/base leakage current on the basis of the tunnel effect is reduced, on the one hand, and, on the other hand, the parasitic emitter/base capacitance is reduced.

The pentavalent doping within the base layer can be diffused into the base layer from an emitter region that borders on the base layer. This diffusion of a pentavalent doping substance from the emitter region into the base layer is advantageous, since in this way, the PN transition can be shifted from a polycrystalline silicon, usually used for the emitter region, to a region of the base layer having crystalline silicon. This has the result that the PN transition lies in a region having few interference locations, and for this reason, the resulting transistor has a better direct-voltage characteristic, with good linearity of the amplification.

In the following, embodiments are explained in greater detail, using related diagrams.

DESCRIPTION OF THE DRAWINGS

FIG. 1 shows a silicon substrate with a transistor, in schematic cross-section.

FIG. 2 shows the concentration progression of doping substances along line A in FIG. 1.

DETAILED DESCRIPTION

FIG. 1 shows a silicon substrate having a base layer 3. An emitter region 11 is arranged above the base layer 3. A collector is arranged below the base layer 3. The base layer 3 has an intrinsic region 4 that lies between the collector 2 and the emitter 1 of the transistor. The emitter 1 is formed from the emitter region 11 and a region that has a counter-doping substance 8, which is diffused into the base layer 3 from the emitter region 11. The broken line in FIG. 1 shows the edge of the counter-doping substance 8.

The base layer 3 furthermore comprises an extrinsic region 6 that runs between a base contact 5 and the intrinsic region 4.

Furthermore, a first doping layer 7, which runs within the extrinsic region 6 and also within the emitter 1, is envisioned in the base layer 3. The first doping layer 7 may be produced by doping with boron. Measured according to a depth scale that begins at the top end of the arrow A (at t0), the first doping layer 7 begins at a depth t1. It extends to a depth t2. In the region between the emitter region 11 and the collector 2, the first doping layer 7 lies completely within the emitter 1. A second doping layer 9 is connected to the first doping layer 7. The second doping layer 9 extends from depth t2 to depth t4. The second doping layer 9 has a lower doping than the first doping layer 7. The second doping layer 9 is connected to a third doping layer 10. The third doping layer 10 extends from depth t4 to depth t5. The collector 2 then begins at depth t5. The third doping layer 10 has a higher doping than the second doping layer 9. All three doping layers 7, 9, 10 may be produced by the doping substance boron.

On the depth scale along the line A, the counter-doping substance 8 extends to depth t3, which means that the counter-doping substance 8 still extends into the second doping layer 9.

FIG. 2 shows the dependence of dopings on concentration along the line A in FIG. 1. Here, the doping-substance concentration C is plotted as a function of the depth t. C4max represents the maximal doping-substance concentration of the counter-doping substance 8 in the region of the base layer 3. Depth t0 marks the boundary between the emitter region 11 and the base layer 3. This is, at the same time, the boundary between a silicon material that is present in polycrystalline form (emitter region 11) and in monocrystalline form (base layer 3). The first doping layer 7 begins at a distance from this boundary layer between the emitter region 11 and the base layer 3. The first doping layer 7 has a doping substance concentration C1 that is essentially constant over the layer thickness t2-t1. The doping substance concentration C1 may be between $1 \times 10^{18}$ and $5 \times 10^{20}$ cm$^{-3}$. The thickness t2-t1 of the first doping layer 7 may be between 10 and 100 nm.

Directly connected to the first doping layer 7 is the second doping layer 9. The doping-substance concentration in the second doping layer 9 is essentially constant and corresponds to the doping-substance concentration C2. C2 may be between $1 \times 10^{18}$ and $1 \times 10^{19}$ cm$^{-3}$. The thickness t4-t2 of the second doping layer 9 is selected in such a manner that at least half of the second doping layer 9 still lies within the region delimited by the counter-doping substance 8 and the outer boundary of the region that represents the emitter 1. This is advantageous for realizing a low parasitic emitter/base capacitance.

The third doping layer 10 still lies next to the second doping layer 9. The third doping layer 10 has a thickness t5-t4, which typically amounts to 5 to 50 nm. The doping substance concentration C3, which is essentially constant within the third doping layer 10, may be between $5 \times 10^{18}$ and $1 \times 10^{20}$ cm$^{-3}$.

It is particularly advantageous if the doping substance concentration C1 of the first doping layer 7 has a sizable proportion of the total amount of doping substance in the base layer 3. In this way, it can be assured that the first doping layer 7 makes a significant contribution to the conductivity of the base layer 3. It is advantageous if the proportion of the first doping layer 7 is 30% or more of the total amount of doping substance that is determined by the first doping layer 7, together with the second doping layer 9 and the third doping layer 10.

The reference symbols indicated in the lower part, below the abscissa, as well as in the upper part of FIG. 2, correspond to the reference symbols used in FIG. 1 for the individual layers.

Furthermore, the counter-doping substance 8 can be seen in FIG. 2. It proceeds from a maximal doping-substance concentration C4max and at first remains constant with increasing depth, and then decreases greatly, approximately at the bottom edge of the first doping layer 7, and finally is reduced to zero within the second doping layer 9. The counter-doping substance 8 marks the outermost edge of the emitter 1. It has the effect that the first doping layer 7 present in the base layer 3, which increases the resistance of the extrinsic base, does not have any negative effects in the intrinsic part of the transistor. Here, the counter-doping is designed in such a way that the doping of the first doping layer 7 is at least compensated, and may be actually over-compensated.

Depending on the boundary between the emitter 1 and the intrinsic region 4 of the base, the intrinsic region 4 extends approximately between the depth t5 and the depth t3, while the emitter 1 extends between the depth t3 and the left edge of FIG. 2. The monocrystalline base layer delimits the emitter region vertically. Laterally, it is defined via photolithography, so that the diffusion of As is effective only in the intrinsic region.

In FIG. 2, a germanium doping 12 can also be seen, which decreases, proceeding from the collector 2, towards the base. Through use of such a ramp-shaped germanium doping 12, an acceleration of the charge carries penetrating into the base from the collector 2 can take place, and this increases the speed of the transistor.

The maximal doping substance concentration of the counter-doping substance 8, C4max, may be in the range between $1 \times 10^{20}$ and $1 \times 10^{21}$ cm$^{-3}$. Arsenic may be used as the counter-doping substance 8. This arsenic is diffused into the base layer 3 from the emitter region 11.

It is also advantageous to ensure, by including carbon atoms in the base layer 3 in a concentration range greater than $1 \times 10^{18}$ cm$^{-3}$, that the diffusion of the trivalent doping substance, in particular the diffusion of boron, is effectively reduced. In this way, the result can be achieved that the width of the base layer 3 can be reduced, thereby resulting in a higher cut-off frequency. The inclusion of carbon atoms can take place, for example, via co-deposition of carbon during the epitactic growth of the base layer 3.

What is claimed is:

1. A transistor comprising:
    a base layer comprising:
        a first doping layer that is doped with a trivalent substance;
        a second doping layer adjacent to the first doping layer and having a lower concentration of the trivalent substance than the first doping layer; and
        a third doping layer adjacent to the second doping layer and having a higher concentration of the trivalent substance than the second doping layer;
        wherein the first doping layer and the second doping layer are counter-doped with a pentavalent substance from an emitter region of the transistor; and
        wherein the base layer comprises carbon atoms having a concentration greater than $1 \times 10^{18}$ cm$^{-3}$.

2. The transistor of claim 1, wherein the second doping layer and the third doping layer are doped with germanium.

3. The transistor of claim 2, wherein a concentration of germanium in the second doping layer and the third doping layer decreases from a high point at a collector region of the transmitter to a low point in the second layer.

4. The transistor of claim 2, wherein a decrease in the concentration of germanium from the high point to the low point is substantially constant.

5. A transistor comprising:
    an emitter region;
    a collector; and
    a base layer having a base contact, the base layer comprising:
        an intrinsic region between the emitter region and the collector;
        an extrinsic region between the intrinsic region and the base contact;
        a first doping layer that is doped with a trivalent substance, and that extends into the extrinsic region;
        a second doping layer that is doped with a trivalent substance, and that is between the first doping layer and the collector, the first and second doping layers being counter-doped with a pentavalent substance from the emitter region; and
        a third doping layer that is doped with a trivalent substance, and that is between the second doping layer and the collector;
    wherein the base layer comprises carbon atoms having a concentration greater than $1 \times 10^{18}$ cm$^{-3}$; and
    wherein a concentration of trivalent substance in the second doping layer is less than a concentration of trivalent substance in the first doping layer, and the concentration of trivalent substance in the second doping layer is less than a concentration of trivalent substance in the third doping layer.

6. The transistor of claim 5, wherein the trivalent substance comprises boron.

7. The transistor of claim 5, wherein the first doping layer comprises at least 30% of a total amount of a doping substance in the base layer.

8. The transistor of claim 6, wherein the first doping layer comprises at least 30% of a total amount of a doping substance in the base layer.

9. The transistor of claim 5, wherein the second doping layer and the third doping layer are doped with germanium.

10. The transistor of claim 9, wherein:
   a concentration of germanium in the second doping layer and the third doping layer decreases from a high point at the collector to a low point in the second layer; and
   a decrease in the concentration of germanium from the high point to the low point is substantially constant.

11. The transistor of claim 9, wherein the trivalent substance comprises boron.

12. The transistor of claim 9, wherein the pentavalent substance comprises arsenic having a concentration of between $1 \times 10^{20}$ cm$^{-3}$ and $1 \times 10^{21}$ cm$^{-3}$.

13. A transistor comprising:
   an emitter region;
   a collector; and
   a base layer having a base contact, the base layer comprising:
   an intrinsic region between the emitter region and the collector;
   an extrinsic region between the intrinsic region and the base contact;
   a first doping layer that is doped with a trivalent substance, that extends into the extrinsic region, and that is counter-doped with a pentavalent substance from the emitter region, wherein the first doping layer comprises a concentration of the trivalent substance that is between $1 \times 10^{18}$ cm$^{-3}$ and $5 \times 10^{20}$ cm$^{-3}$;
   a second doping layer that is doped with the trivalent substance, that extends into the extrinsic region, and that is counter-doped, at least part-way through, with a pentavalent substance from the emitter region, wherein the second doping layer comprises a concentration of the pentavalent substance that is between $1 \times 10^{20}$ cm$^{-3}$ and $1 \times 10^{21}$ cm$^{-3}$, wherein the second doping layer comprises a concentration of the trivalent substance that is between $1 \times 10^{18}$ cm$^{-3}$ and $1 \times 10^{19}$ cm$^{-3}$; and
   a third doping layer that is doped with the trivalent substance, the third doping layer being adjacent to the collector, wherein the third doping layer comprises a concentration of the dopant that is between $5 \times 10^{18}$ cm$^{-3}$ and $1 \times 10^{20}$;
   wherein the second doping layer is between the first doping layer and the third doping layer, and wherein the second doping layer has a lower concentration of the trivalent substance than both the first doping layer and the third doping layer;
   wherein the first doping layer, the second doping layer, and the third doping layer are separated from the emitter region by a portion of the base layer; and
   wherein the base layer comprises carbon atoms having a concentration greater than $1 \times 10^{18}$ cm$^{-3}$.

\* \* \* \* \*